US008994458B2

(12) United States Patent
Saint-Laurent

(10) Patent No.: US 8,994,458 B2
(45) Date of Patent: Mar. 31, 2015

(54) OSCILLATOR BASED FREQUENCY LOCKED LOOP

(75) Inventor: Martin Saint-Laurent, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 302 days.

(21) Appl. No.: 13/291,206

(22) Filed: Nov. 8, 2011

(65) Prior Publication Data

US 2013/0113530 A1    May 9, 2013

(51) Int. Cl.
*H03L 7/085* (2006.01)
*H03L 7/00* (2006.01)
*G06F 1/10* (2006.01)

(52) U.S. Cl.
CPC ... *H03L 7/00* (2013.01); *G06F 1/10* (2013.01)
USPC ................. 331/1 A; 331/34; 331/74; 327/291

(58) Field of Classification Search
CPC .......................................................... G06F 1/10
USPC ......... 331/34, 1 A, 57, 74; 327/156, 161, 291
See application file for complete search history.

(56) References Cited

U.S. PATENT DOCUMENTS

| 5,805,909 | A | 9/1998 | Diewald |
| 5,900,757 | A | 5/1999 | Aggarwal et al. |
| 7,605,666 | B2 * | 10/2009 | Karabatsos ..................... 331/16 |
| 7,705,687 | B1 * | 4/2010 | Paz .............................. 331/57 |
| 7,746,178 | B1 | 6/2010 | Humphreys et al. |
| 7,764,132 | B2 | 7/2010 | Jacobowitz et al. |
| 7,786,776 | B2 | 8/2010 | Yamakido et al. |
| 8,471,614 | B2 * | 6/2013 | Luo .............................. 327/158 |
| 2002/0145474 | A1 | 10/2002 | Jordan et al. |
| 2006/0203937 | A1 | 9/2006 | Burgio |

FOREIGN PATENT DOCUMENTS

EP    1152536 A1    11/2001

OTHER PUBLICATIONS

International Search Report and Written Opinion—PCT/US2012/063967—ISA/EPO—Sep. 25, 2013.

* cited by examiner

*Primary Examiner* — Arnold Kinkead
(74) *Attorney, Agent, or Firm* — Peter Michael Kamarchik; Nicholas J. Pauley; Joseph Agusta

(57) ABSTRACT

A method includes determining a control setting and selectively stopping oscillation of an oscillator after a time period. The oscillator is configured to remain in an active mode after the time period. The method further includes applying the control setting to the oscillator.

26 Claims, 5 Drawing Sheets

OSCILLATOR BASED FREQUENCY LOCKED LOOP

I. FIELD

The present disclosure is generally related to clock generation.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications such as a web browser application, that can be used to access the Internet. As such, these wireless telephones can include significant computing capabilities. These wireless telephones may also include various clock sources to provide clocks to the devices incorporated therein.

A device may include a clock with a particular frequency and quality. A clock that has a relatively low frequency and a relatively high jitter may be used in some devices while a clock with a higher frequency and low jitter may be used in other devices. For example, a digital signal processor inside a mobile phone may operate using a relatively low frequency (e.g., 100 MHz) and high jitter clock to perform some tasks, such as playing an MP3 song. Additionally, designs with asynchronous interfaces may adequately operate using a high jitter clock. Use of a phase locked loop (PLL) circuit in designs and applications that may operate using low frequency and high jitter clocks may waste power. Additionally, a PLL may take up a large area in a device and may also involve use of a power supply that is separate from a power supply for other components of the device.

III. SUMMARY

A frequency-locked loop (FLL) may generate a relatively low frequency output clock. The output clock may have a frequency that is a multiple of an input clock frequency. For example, the FLL may generate a 100 MHz output clock that has a relatively high jitter based on a 10 MHz input clock. The FLL may use a digitally controlled oscillator (DCO) to generate the output clock. The FLL may determine whether the output clock is within a tolerance range of a target frequency based on a number of output clock cycles generated during one or more clock periods of an input clock. The FLL may also indicate a locked condition when the frequency of the output clock is within a tolerance range of a target frequency.

In a particular embodiment, a device includes an oscillator and logic to selectively stop oscillation of the oscillator after a time period. The oscillator is configured to remain in an active mode after the time period. The apparatus also includes control logic that determines a control setting and selectively applies the control setting to the oscillator.

In another particular embodiment, a method includes determining a control setting and selectively stopping oscillation of an oscillator after a time period. The oscillator is configured to remain in an active mode after the time period. The method further includes applying the control setting to the oscillator.

In another particular embodiment, an apparatus includes means for determining a control setting and means for selectively stopping oscillation of an oscillator after a time period. The oscillator is configured to remain in an active mode after the time period. The apparatus further includes means for applying the control setting to the oscillator.

In another particular embodiment, a non-transitory computer-readable medium includes program code that, when executed by a processor, causes the processor to determine a control setting and selectively stop oscillation of an oscillator after a time period. The oscillator is configured to remain in an active mode after the time period. The program code further causes the processor to apply the control setting to the oscillator.

One particular advantage provided by at least one of the disclosed embodiments is generation of a clock suitable for devices that operate at a relatively low clock frequency and that tolerate a relatively high jitter clock. A device that generates a low frequency and relatively high jitter clock may take up smaller design area and consume less power than a phased-locked-loop (PLL) circuit. The device may be designed using digital logic gates, which may enable sharing of a power supply with other devices. Further, a device that has a fully digital design may enable use of automatic test generation pattern tools to perform production testing.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
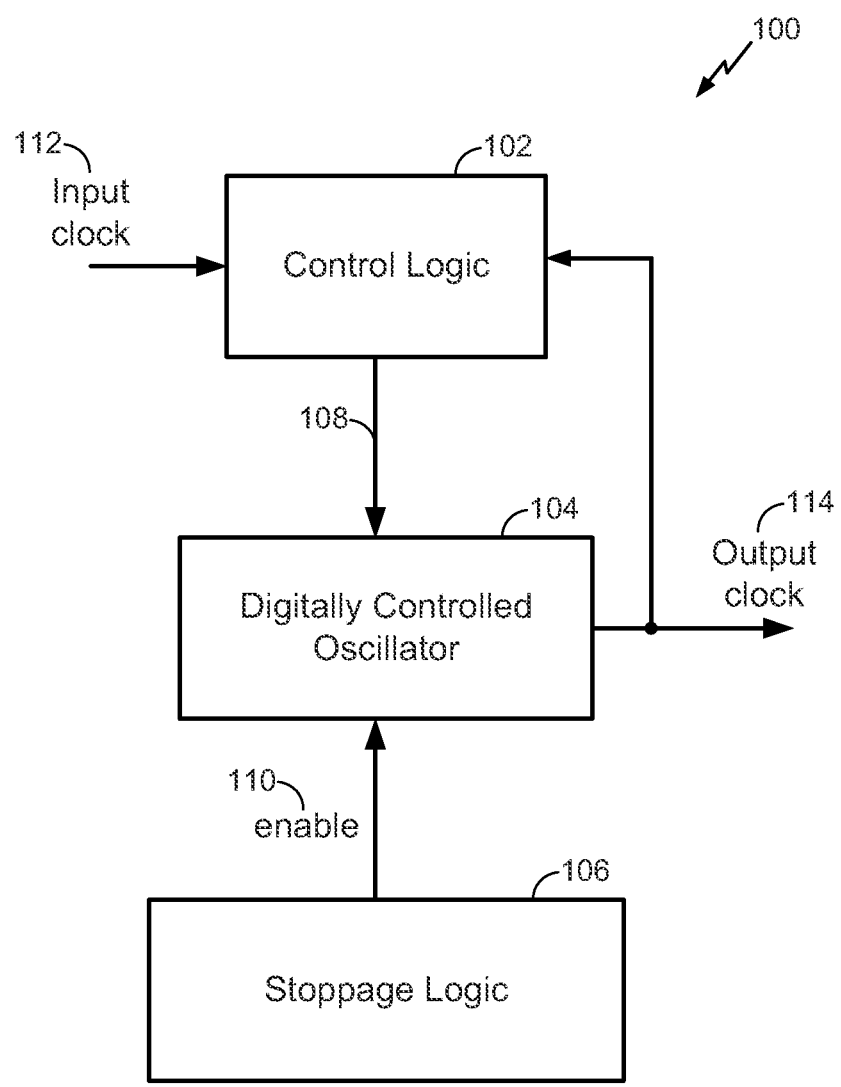
FIG. 1 is a block diagram a particular illustrative embodiment of a device that is operable to generate a clock.

Referring to FIG. 1, a particular illustrative embodiment of a device that is operable to generate a clock is depicted and generally designated 100. The device 100 may be configured to generate a relatively low frequency clock. The device 100 includes control logic 102, a digitally controlled oscillator (DCO) 104, and stoppage logic 106. The control logic 102 may be coupled to the DCO 104. The stoppage logic 106 may be coupled to the DCO 104. The DCO 104 may be configured to receive a control setting 108 from the control logic 102 and to provide an output clock 114 to the control logic 102. The DCO 104 may be further configured to receive an enable 110 from the stoppage logic 106.

In a particular embodiment, the control logic 102 may be configured to receive an input clock 112 and the output clock 114 and to generate the control setting 108. The control logic 102 may determine the control setting 108 and may selectively apply the control setting 108 to the DCO 104. For example, the control setting 108 may be an initial control setting or a modified control setting. The control logic 102 may be configured to apply an initial control setting to the DCO 104 during a time period. The time period may be at least one clock period of the output clock 114 of the DCO 104. The control logic 102 may be further configured to determine a modified control setting during the time period. The control logic 102 may apply the modified control setting during a second time period after the time period. In a particular embodiment, the control logic 102 may apply the modified control setting 108 on a falling edge of the output clock 114. The time period and the second time period may be temporally contiguous. In another embodiment, the control setting may be an analog voltage. In yet another embodiment, the control setting may be an analog current.

The control logic 102 may be configured to adjust the control setting 108 based on a frequency of the output clock 114. For example, the control logic 102 may increment or increase a value of the control setting 108 in response to determining that a frequency of the output clock 114 is below a desired frequency. Similarly, the control logic 104 may decrement or decrease a value of the control setting 108 in response to determining that a frequency of the output clock 114 exceeds a desired frequency. Alternatively, the control logic 102 may increment or increase a value of the control setting 108 in response to determining that a frequency of the output clock 114 exceeds a desired frequency. Similarly, the control logic 102 may decrement or decrease a value of the control setting 108 to increase a frequency of the output clock 114 in response to determining that the frequency of the output clock 114 is below a desired frequency. In a particular embodiment, the control logic 102 may determine the control setting 108 based on a number of cycles of the output clock 114 during one or more clock periods of the input clock 112.

In a particular embodiment, the DCO 104 may be configured to generate the output clock 114 based on oscillation of the DCO 104. A frequency of the output clock 114 may be adjusted in response to the control setting 108. To illustrate, the output clock 114 may have a first frequency value based on a first value of the control setting 108 and may have a second frequency value based on a second value of the control setting 108. For example, the DCO 104 may increase a frequency of the output clock 114 in response to an incremented value of the control setting 108. Similarly, the DCO 104 may decrease a frequency of the output clock 114 in response to a decremented value of the control setting 108. In an alternative embodiment, the DCO 104 may increase a frequency of the output clock 114 in response to a decremented value of the control setting 108. Similarly, the DCO 104 may decrease a frequency of the output clock 114 in response to an incremented value of the control setting 108.

In a particular embodiment, a frequency of the output clock 114 may be approximately a multiple of a frequency of an input clock 112. For example, a frequency of the output clock 114 may approximately equal an integer multiple of a frequency of the input clock 112. To illustrate, the frequency of the output clock 114 may be a particular percentage (e.g., 6.25%) higher or lower than an integer multiple of a frequency of the input clock 112. As another example, a frequency of the output clock 114 may be approximately equal a non-integer multiple of a frequency of the input clock 112. To illustrate, the frequency of the output clock 114 may be a particular percentage (e.g., 6.5%) higher or lower than a non-integer multiple of the frequency of the input clock 112.

The stoppage logic 106 may be configured to generate an enable signal 110 that is provided to the DCO 104. The stoppage logic 106 may selectively stop oscillation of the DCO 104 after a time period. In a particular embodiment, the time period may correspond to a period between a start or a restart of oscillation of the DCO 104 and a last active edge (e.g., a rising edge) of the output clock 114 before the enable signal 110 toggles to a value that may stop oscillation of the DCO 104. The stoppage logic 106 may stop oscillation of the DCO 104 by changing the enable 110 from a first value that enables oscillation of the DCO 104 to a second value that stops oscillation of the DCO 104. For example, the stoppage logic 106 may change the enable 110 from the first value to the second value after the DCO 104 generates the output clock 114 for at least one cycle of the output clock 114. To illustrate, the stoppage logic 106 may change a value of the enable 110 from a digital logic value of '1' to a digital logic value of '0' after approximately 2 clock cycles of the output clock 114 following a start of oscillation the DCO 104.

The stoppage logic 106 may be further configured to restart oscillation of the DCO 104 after a second time period. For example, the stoppage logic 106 may restart oscillation of the DCO 104 by changing the enable 110 from the second value that stops oscillation of the DCO 104 to the first value that enables oscillation of the DCO 104. The stoppage logic 106 may restart oscillation of the DCO 104 after the second time period. The stoppage logic 106 may be further configured to stop oscillation of the DCO 104 after a third time period. The third time period may correspond to a period following the second time period. For example, a second modified control setting may be determined during the third time period and the second modified control setting may be applied to the DCO 104 after the third time period.

During operation, the control logic 102 may apply an initial control setting 108 to the DCO 104 during a time period. In response to the initial control setting 108 being applied to the DCO 104, the DCO 104 may generate the output clock 114 having a first frequency. During the time period, the control logic 102 may also determine a modified control setting based on the first frequency of the output clock 114. For example, if the control logic 102 determines that a number of cycles of the output clock 114 during one clock period of the input clock 112 is fewer than a target number of cycles, the control logic 102 may determine that a frequency of the output clock 114 is below a desired frequency. Accordingly, the control logic 102 may determine a modified control setting that increases the frequency of the output clock 114. As another example, if the control logic 102 determines that a number of cycles of the output clock 114 during one clock period of the input clock 112 is more than a target number of cycles, the control logic 102 may determine that a frequency of the output clock 114 exceeds a desired frequency. Accordingly, the control logic 102 may determine a modified control setting that decreases the frequency of the output clock 114.

After the time period and during a second time period, the stoppage logic 106 may stop oscillation of the DCO 104 by changing the enable 110 from a first value that enables oscillation to a second value that disables (i.e., stops) oscillation. For example, the stoppage logic 106 may stop oscillation of the DCO 104 after a particular number of cycles of the output clock 114 following a start or restart of oscillation of the DCO 104. The DCO 104 may remain in active mode while the oscillation of the DCO 104 is stopped. The stoppage logic 106 may apply the modified control setting during the second time period. The stoppage logic 106 may also restart oscillation of the DCO 104 after the second time period. To illustrate, the stoppage logic 106 may restart oscillation of the DCO 104 by changing the enable 110 to a value that enables oscillation of the DCO 104. In a particular embodiment, the second time period may start when the time period ends and may end before the enable 110 toggles to a value that may enable oscillation of the DCO 104.

By adjusting the control setting 108 based on a frequency of the output clock 114, the frequency of the output clock 114 may be iteratively changed until the frequency of the output clock 114 approximately equals a desired frequency or until the frequency of the output clock 114 is within a tolerance range of the desired frequency. By adjusting the control setting 108 based on a number of cycles of the output clock 114 during one or more clock periods of the input clock 112, the output clock 114 may have a frequency that is approximately a multiple of a frequency of the input clock 112. Additionally, by stopping oscillation of the DCO 104 while applying a modified control setting, glitches in the output clock 114 may be prevented.

Although FIG. 1 illustrates that the input clock 112 is provided to the control logic 102, in an alternative embodiment, the control logic 102 may receive a frequency indication that indicates whether a frequency of the output clock 114 is too high, too low, or within a tolerance range of a desired frequency. The control logic 102 may determine the control setting 108 based on the frequency indication. In a particular embodiment, the DCO 104 may include a digital-to-analog converter and a voltage-controlled oscillator. In another embodiment, the DCO 104 may include a digital-to-analog converter and a current-controlled oscillator. Additionally, in a particular embodiment, the control setting 108 may be an analog current-based control setting or an analog voltage-based control setting, and the DCO 104 may be an oscillator that is configured to receive an analog control setting.

Figure 2:
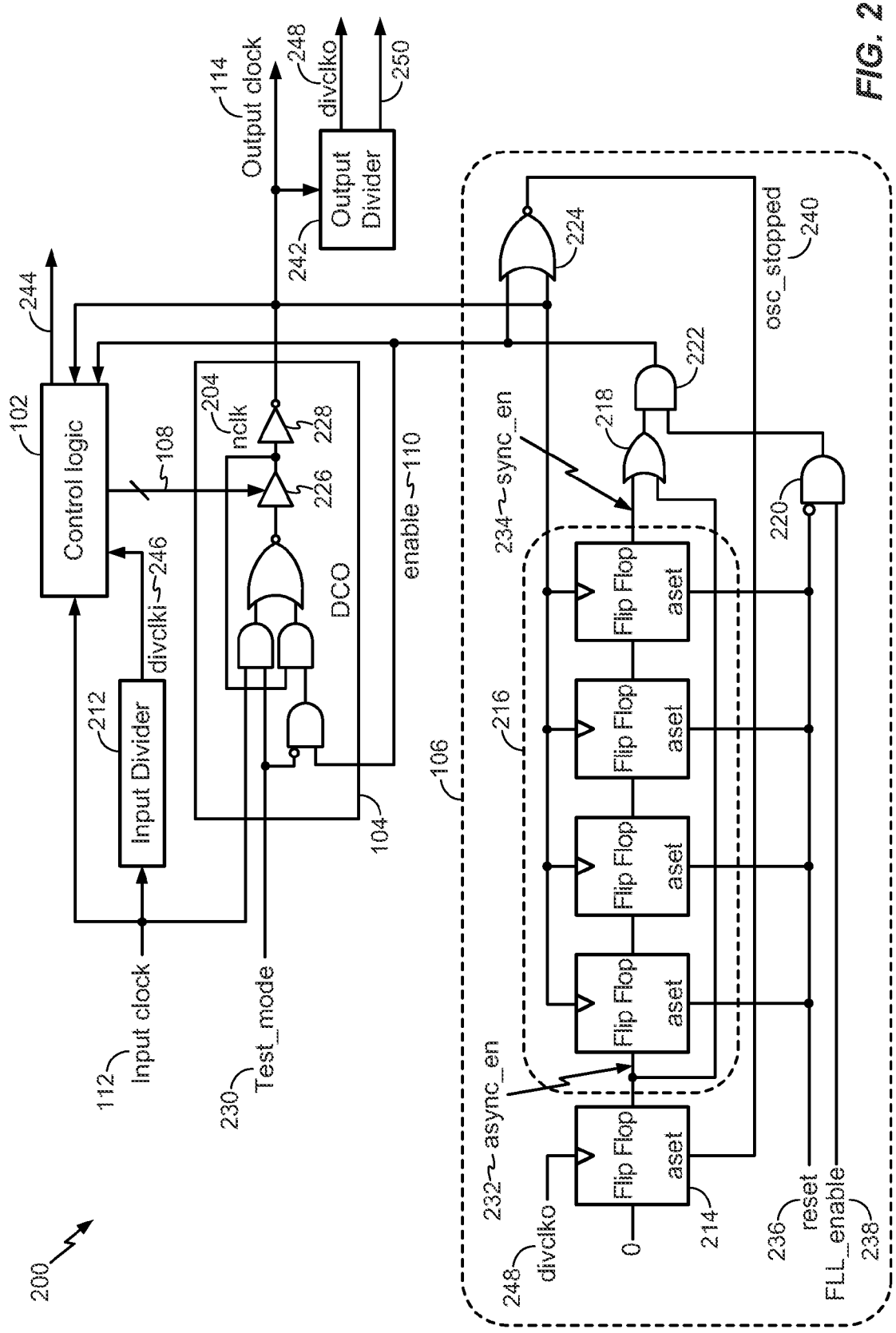
FIG. 2 is a diagram of a particular illustrative implementation of the device of FIG. 1.

Referring to FIG. 2, a particular illustrative embodiment of an implementation of the device 100 of FIG. 1 is depicted and generally designated 200. The device 200 includes an input divider 212, the control logic 102, the DCO 104, the stoppage logic 106, and an output divider 242. The input divider 212 is coupled to the control logic 102. The output divider 242 is coupled to the DCO 104 and to the stoppage logic 106.

The input divider 212 may be configured to divide the input clock 112 and to generate a divided input clock (divclki) 246. For example, the input divider 212 may divide down the input clock 112, such that a frequency of the input clock 112 is a multiple of a frequency of the divided input clock (divclki) 246. To illustrate, a frequency of the input clock 112 may be an integer or non-integer multiple of a frequency of the divided input clock (divclki) 246. In a particular embodiment, the divided input clock (divclki) 246 is input to the control logic 102.

The control logic 102 may be configured to receive the input clock 112 and the divided input clock (divclki) 246. The control logic 102 may also receive the enable 110 from the stoppage logic 106 and may receive the output clock 114 from the DCO 104. In a particular embodiment, the control logic 102 may be configured to be tested using at least one automatic test pattern generation test. As described with respect to FIG. 1, the control logic 102 may determine the control setting 108 and may apply the control setting 108 to the DCO 104. For example, the control setting 108 may be applied to a variable delay element 226 of the DCO 104. A frequency of the output clock 114 may be adjusted in response to the control setting 108 that may be provided to the variable delay element 226 of the DCO 104. The control logic 102 may use the enable 110 to determine when to change the value of the control setting 108 that is applied to the DCO 104. Alternatively, the control logic 102 may use a counter to determine when to change the value of the control setting 108.

In a particular embodiment, the control logic 102 may determine the control setting 108 based on a number of cycles of the output clock 114 during one or more clock periods of the input clock 112. Alternatively, the control logic 102 may use the divided input clock (divclki) 246 instead of the input clock 212 to determine the control setting 108. For example, the control logic 102 may determine the control setting 108 based on a number of cycles of the output clock 114 during one or more clock periods of the divided input clock (divclki) 246. The control logic 102 may determine the control setting 108 during a time period. In a particular embodiment, the time period may correspond to a period following an active edge (e.g., rising edge) of a divided output clock (divclko) 248 and ending at a particular active edge (e.g., rising edge) of the output clock 114.

In a particular embodiment, the control logic 102 may adjust the control setting 108 to generate the output clock 114 having a frequency that approximately equals a desired frequency. The control logic 102 may adjust the control setting 108 to increase or to decrease a frequency of the output clock 114 until the frequency of the output clock 114 is within a tolerance range of the desired frequency. For example, the desired frequency may be specified as a frequency value, and the tolerance range may be specified as a percentage of the desired frequency. The desired frequency may be fixed or programmable. The desired frequency may be provided to the control logic 102 at power-up of the device 200, may be hardwired, or a combination thereof. The tolerance range may also be fixed or programmable.

In an alternative embodiment, a target number of clock cycles of the output clock 114 during one or more clock periods of the input clock 112 or the divided input clock (divclki) 246 may be specified. For example, the target number of clock cycles of the output clock 114 may correspond to a desired frequency. To illustrate, a frequency of the output clock 114 may be within a tolerance range of a desired frequency if a number of clock cycles of the output clock 114 during a clock period of the input clock 112 is within a particular percentage of the target number of clock cycles of the output clock 114. As an illustrative, non-limiting example, the tolerance range may correspond to a range between 6.25 percent above and below the target number of clock cycles of the output clock 114 that corresponds to a desired frequency of the output clock 114. In an alternative embodiment, the tolerance range may be specified as a range between a first number and a second number that includes the target number of clock cycles of the output clock 114. The target number of clock cycles of the output clock 114 may be fixed or programmable. The target number of clock cycles of the output clock 114 may be provided to the control logic 102 at power-up of the device 200, may be hardwired, or any combination thereof. The tolerance range may also be fixed or programmable.

The control logic 102 may be further configured to generate a lock indicator 244. The lock indicator 244 may provide an indication that a frequency of the output clock 114 of the DCO 104 is within a tolerance range of a desired frequency. In a particular embodiment, the control logic 102 determines during every cycle of the input clock 112 whether a frequency of the output clock 114 is within a tolerance range of a desired frequency.

In a particular embodiment, the DCO 104 includes the variable delay element 226, an inverter 228, and other digital logic gates, as illustrated in FIG. 2. The DCO 104 may be configured to receive a test mode indicator (test_mode) 230, the input clock 112, the control setting 108, and the enable 110, and to generate the output clock 114. A frequency of the output clock 114 may be adjusted in response to the control setting 108 that may be provided to the variable delay element 226 of the DCO 104. For example, a frequency of the output clock 114 may be adjusted by changing the delay of the variable delay element 226 based on the control setting 108.

As an illustrative, non-limiting example, the variable delay element 226 may have 32 settings and the control setting 108 may be five bits wide. The output clock 114 may be an inverted version of an output (nclk) 204 of the variable delay element 226. In a particular embodiment, the variable delay element 226 may include an odd number of serially connected inverters.

The test mode indicator (test_mode) 230 may control modes of operation of the DCO 104. For example, based on a first value of the test mode indicator (test_mode) 230 corresponding to a test mode of operation, the input clock 112 may propagate through the variable delay element 226 and through the inverter 228 to be output as the output clock 114. The first value of the test mode indicator (test_mode) 230 may enable the DCO 104 to be tested using at least one automatic test pattern generation test. The first value of the test mode indicator (test_mode) 230 may further enable the output clock 114 to be compatible with automatic test pattern generation.

The DCO 104 may operate in an active (i.e., non-test) mode based on a second value of the test mode indicator (test_mode) 230. In the active mode of operation, a value of the output (nclk) 204 may be provided to the variable delay element 226 through logic gates depending on a value of the enable 110. For example, a value of the output (nclk) 204 may be fed back to the variable delay element 226 through the logic gates if the enable 110 has a first value. The first value of the enable 110 may enable oscillation of the DCO 104 by enabling the value of the output (nclk) 204 to be provided to the variable delay element 226. A second value of the enable 110 may prevent the value of the output (nclk) 204 from being provided to the variable delay element 226. By preventing the value of output (nclk) 204 from being provided to the variable delay element 226, the second value of the enable 110 may prevent oscillation of the DCO 104.

In a particular embodiment, the output clock 114 of the DCO 104 may be provided to a first processing circuit. The DCO 104 may share a power supply with the first processing circuit.

The output divider 242 is configured to divide the output clock 114 and to generate the divided output clock (divclko) 248. For example, the output divider 242 may divide down the output clock 114, such that a frequency of the output clock 114 is a multiple of a frequency of the divided output clock (divclko) 248. To illustrate, a frequency of the output clock 114 may be an integer multiple or a non-integer multiple of a frequency of the divided output clock (divclko) 248. In a particular embodiment, the divided output clock (divclko) 248 may be provided to the stoppage logic 106. The output clock 114 and the divided output clock (divclko) 248 may be synchronous to each other.

The stoppage logic 106 may be configured to generate the enable 110 that is provided to the control logic 102 and to the DCO 104. In a particular embodiment, the stoppage logic 106 includes a first flip-flop 214, serially connected flip-flops 216, a first digital logic gate 218, a second digital logic gate 220, a third digital logic gate 222, and a fourth digital logic gate 224. The first flip-flop 214 may be clocked by the divided clock (divclko) 248. The first flip-flop 214 may be configured to generate an asynchronous enable (async_en) 232 that may be input to the first flip-flop of the serially connected flip-flops 216. All the flip-flops of the serially connected flip-flops 216 may be clocked by the output clock 114. The last flip-flop of the serially connected flip-flops 216 may be configured to generate a synchronous enable (sync_en) 234 based on the asynchronous enable (async_en) 232 that may be propagated through the serially connected flip-flops 216.

The asynchronous enable (async_en) 232 and the synchronous enable (sync_en) 234 may be coupled to the first digital logic gate 218. A reset 236 and an FLL_enable 238 may be input to the second digital logic gate 220. An output of the first digital logic gate 218 and an output of a second digital logic gate 220 may be coupled to the third digital logic gate 222. The third digital logic gate 222 may generate the enable 110 that is provided to the DCO 104 and to the control logic 102. The enable 110 and the output clock 114 may be input to the fourth digital logic gate 224. The fourth digital logic gate 224 may generate an output osc_stopped 240. The output osc_stopped 240 may be provided to a reset input (aset) of the first flip-flop 214. As an illustrative example, when the output osc_stopped 240 is asserted (e.g., the output osc_stopped 240 has a digital logic value of '1'), the output of the first flip-flop 214 may be forced to a known value, such as a digital logic value of '1,' and when the output osc_stopped 240 is deasserted, the output of the first flip-flop 214 may remain unchanged until a next rising edge of the divided input clock (divclki) 246.

During operation, the input divider 212 may divide the input clock 112 and provide the divided input clock (divclki) 246 to the control logic 102. The output divider 242 may divide the output clock 114 and provide the divided output clock (divclko) 248 to the stoppage logic 106. The control logic 102 may determine a number of cycles of the output clock 114 during a clock period of the input clock 112. During a time period, the control logic 102 may continue to apply to the DCO 104 the control setting 108 having a value determined prior to the time period. The time period may start at approximately a first edge (e.g., a first rising edge) of the output clock 114 following an edge (e.g., a rising edge) of the divided output clock (divclko) 248 and may end at approximately an edge (e.g., a rising edge) of the output clock 114 that results in toggling (e.g., from a digital logic value of '1' to a digital logic value of '0') of the synchronous enable (sync_en) 234. Based on the number of cycles of the output clock 114 in the clock period of the input clock 112, the control logic 102 may determine, during the time period, whether a frequency of the output clock 114 is too high, too low, or within a tolerance range relative to a desired frequency. The control logic 102 may determine the control setting 108 in response to determining whether a frequency of the output clock 114 is too high, too low, or within the tolerance range relative to the desired frequency. If the frequency of the output clock 114 is within the tolerance range relative to the desired frequency, the control logic 102 may generate the lock indicator 244 having a value that indicates the frequency of the output clock 114 is within the tolerance range of the desired frequency. If the frequency of the output clock 114 is too high or too low, the control logic 102 may generate the lock indicator 244 having a value that indicates the frequency of the output clock 114 is outside the tolerance range of the desired frequency.

During a second time period following the time period, the stoppage logic 106 may generate the enable 110 having a value that may stop oscillation of the DCO 104. Oscillation of the DCO 104 may be selectively stopped without causing clock glitch events in the output clock 114 of the DCO 104. During the second time period and on an edge (e.g., a falling edge) of the output clock 114, the control logic 102 may apply the control setting 108 determined in the time period to the DCO 104. After the second time period, the control logic 102 may restart oscillation of the DCO 104 by generating a value of the enable 110 that enables oscillation of the DCO 104.

During a third time period following the second time period, the control logic 102 may determine whether a frequency of the output clock 114 is too high, too low, or within the tolerance range relative to the desired frequency. Subsequent operations of the control logic 102, the DCO 104, and the stoppage logic 106 as described above may be repeated following a determination by the control logic 102 whether the frequency of the output clock 114 is too high, too low, or within the tolerance range relative to the desired frequency. For example, the stoppage logic 106 may selectively stop oscillation of the DCO 104 after the third time period.

By determining whether a frequency of the output clock 114 is too high, too low, or within a tolerance range of a desired frequency, the frequency of the output clock 114 may be adjusted to be within the tolerance range of the desired frequency. Additionally, by providing the lock indicator 244 that indicates whether the frequency of the output clock 114 is within the tolerance range of the desired frequency, the device 200 may enable other devices to determine whether to use output clock 114. By stopping oscillation of the DCO 104 without causing a glitch in the output clock 114, the device 200 may provide a glitch-free clock for use by other devices.

Although FIG. 2 illustrates that the serially connected flip-flops 216 include four flip-flops, in an alternative embodiments, the serially connected flip-flops 216 may have fewer than four flip-flops or more than four flip-flops. Additionally, individual digital logic gates or groups of digital logic gates shown in FIG. 2 may be replaced by one or more functionally equivalent logic gates. Further, the control logic 102 may use a counter to determine a start and/or an end of some or all of time periods, such as the time period and the second time period.

Figure 3:
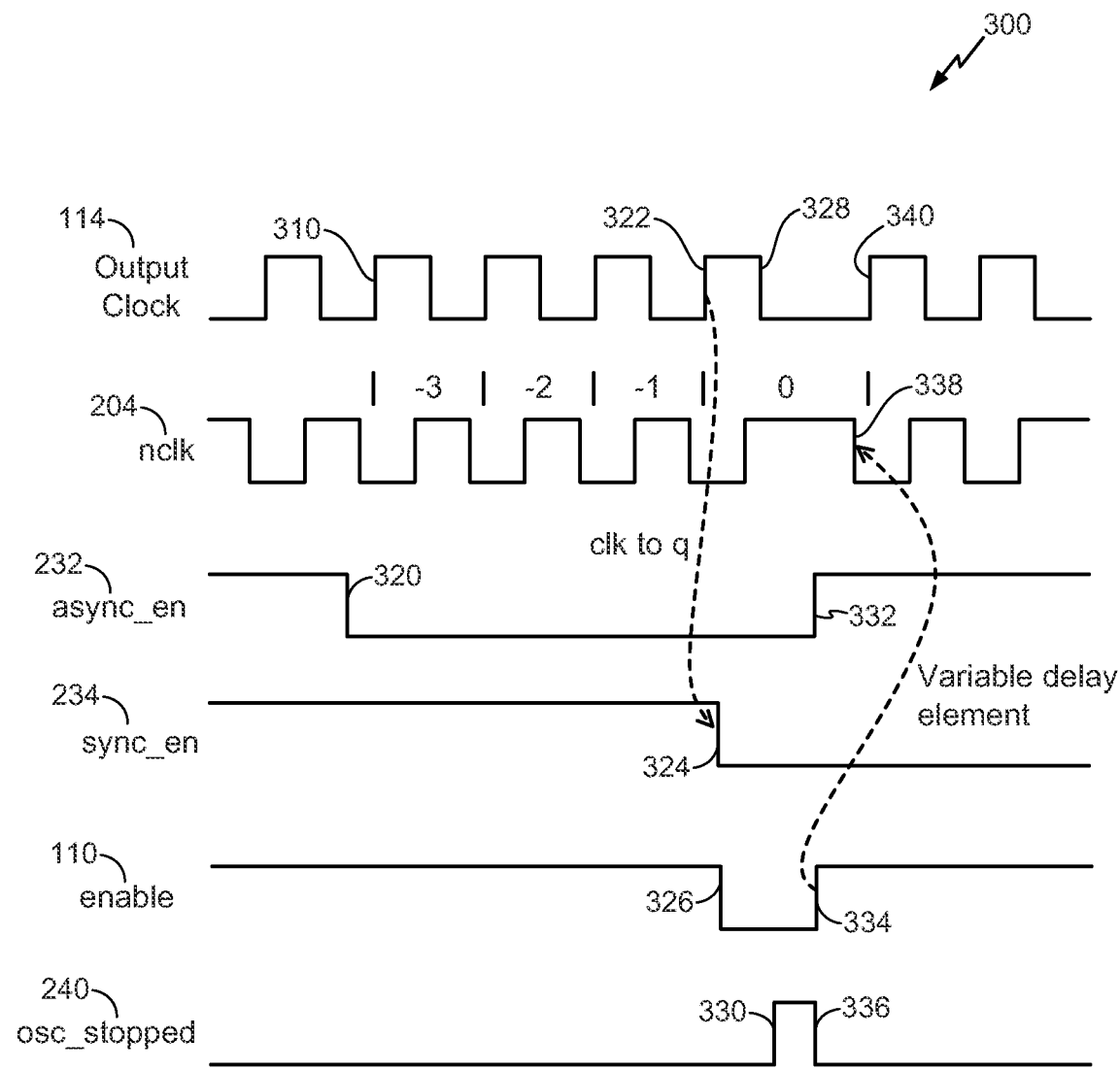
FIG. 3 is a timing diagram illustrating signal traces that correspond to a particular embodiment of operation of the circuit of FIG. 2.

Referring to FIG. 3, a timing diagram illustrating signals that correspond to an operation of the device 200 of FIG. 2 to generate an output clock, such as the output clock 114, is depicted and generally designated 300. The diagram 300 includes the output clock 114, the output (nclk) 204, the asynchronous enable (async_en) 232, the synchronous enable (sync_en) 234, the enable 110, and the output osc_stopped 240.

The asynchronous enable (async_en) 232 may transition from a high value to a low value at transition 320. The output clock 114 may transition from a low value to a high value at transition 310. In a particular embodiment, the transition 310 may correspond to a start of a time period, such as the time period described with respect to FIGS. 1 and 2. At transition 322, the output clock 114 may again transition from a low value to a high value. In a particular embodiment, the transition 322 may correspond to an end of a time period, such as the time period described with respect to FIGS. 1 and 2. The transition at 322 may also indicate a start of a second time period, such as the second time period described with respect to FIGS. 1 and 2. As described with respect to FIGS. 1 and 2, control logic, such as the control logic 102, may determine the control setting 108 during the time period.

In response to a rising edge of the output clock 114 at transition 322, the synchronous enable (sync_en) 234 may transition from a high value to low value at transition 324. At transition 326, the enable 110 may transition from a high value to a low value in response to the asynchronous enable (async_en) 232 having a low value and the synchronous enable (sync_en) 234 transitioning from a high value to a low value. In a particular embodiment, a low value of the enable 110 may stop oscillation of a DCO, such as the DCO 104 of FIGS. 1 and 2.

At transition 328, the output clock 114 may transition from a high value to a low value. In a particular embodiment, at transition 328, control logic (e.g., the control logic 102 of FIGS. 1 and 2) may apply the control setting determined during the time period to a DCO. The output osc_stopped 240 transitions from a low value to a high value at transition 330 based on the enable 110 having a low value and the output clock 114 transitioning at transition 328 from a high value to a low value. In a particular embodiment, the transition 330 corresponds to an end of a second time period, such the second time period described with respect to FIGS. 1 and 2. In response to the output osc_stopped 240 transitioning from a low value to a high value at transition 330, the asynchronous enable (async_en) 232 may transition from a low value to a high value at transition 332. For example, the osc_stopped 120 may be provided to a reset input of a flip-flop, such as the first flip-flop 214 of FIG. 2, to transition the asynchronous enable (async_en) 232 from a low value to a high value.

In response to the asynchronous enable (async_en) 232 transitioning from a low value to a high value at transition 332, the enable 110 may transition from a low value to a high value at transition 334. In a particular embodiment, a high value of the enable 110 enables oscillation of a DCO, such as the DCO 104 of FIGS. 1 and 2. At transition 336, the output osc_stopped 240 transitions from a high value to a low value in response to the enable 110 transitioning from a low value to a high value at transition 334. In a particular embodiment, a low value of the output osc_stopped 240 releases reset of a flip-flop, such as the first flip-flop 214 of FIG. 2. In an alternative embodiment, a low value of the enable 110 may enable oscillation of a DCO and a high value of the output osc_stopped 240 may release reset of a flip-flop.

At transition 338, the output (nclk) 204 (corresponding to an output of a variable delay element, such as the variable delay element 226 of FIG. 2) transitions from a high value to a low value. The timing difference between the transition of the enable 110 at 334 and the transition of the output (nclk) 204 at 338 may be partially based on a delay through the variable-delay element. At transition 340, the output clock 114 transitions from a low value to a high value in response to the transition of the output (nclk) 204 at 338. The above described process may be repeated, for example, initiated by an active edge of a clock, such as the divided output clock (divclko) 248 of FIG. 2, that is provided to a flip-flop, such as the first flip-flop 214, that generates the asynchronous enable (async_en) 232. By repeatedly determining and applying a control setting to a DCO, a frequency of an output clock 114 of the DCO 104 may be adjusted and/or maintained within a tolerance range of a desired frequency.

Figure 4:
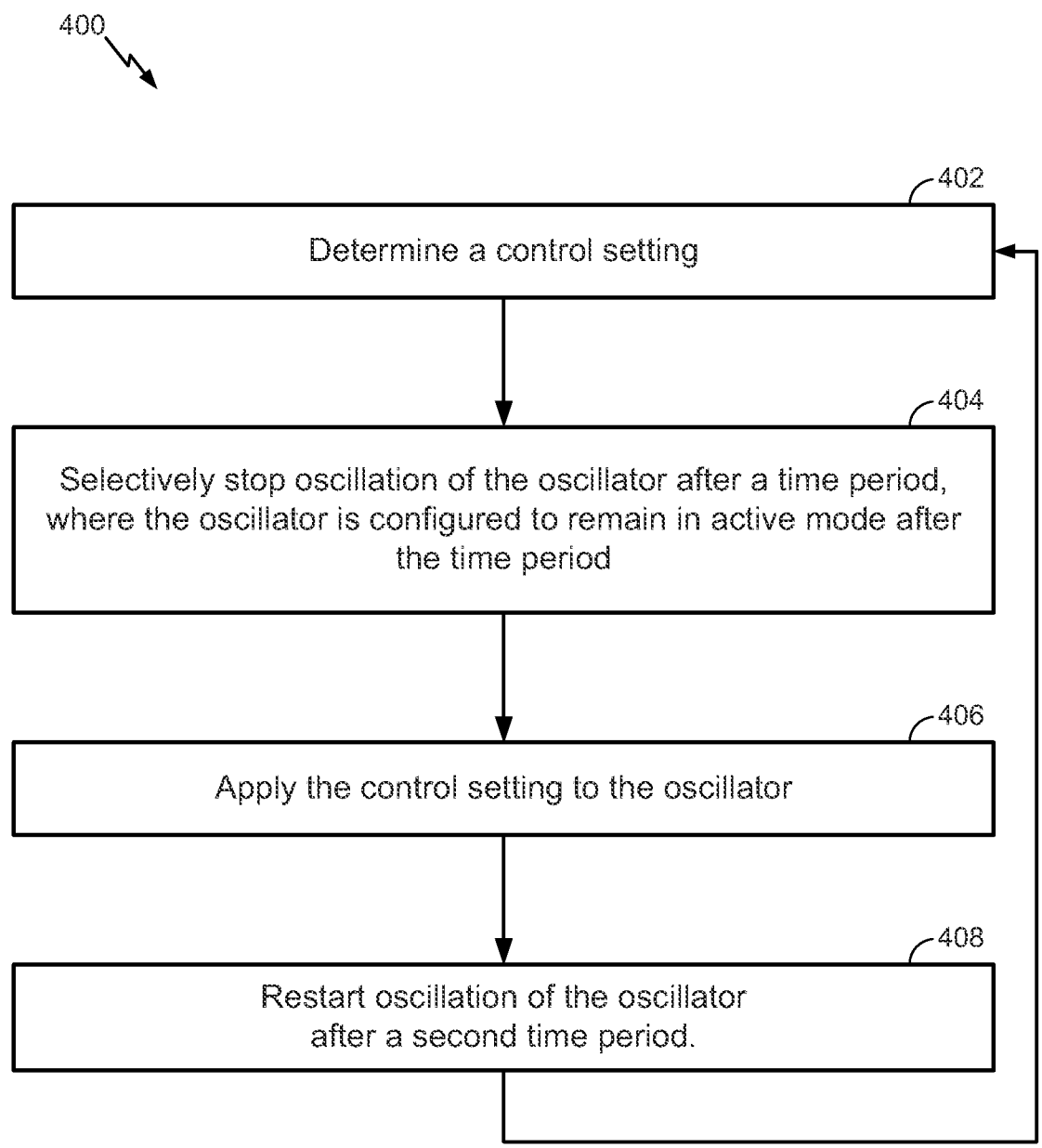
FIG. 4 is a flow chart of a particular illustrative embodiment of a method of operating either of the circuits of FIGS. 1 and 2.

Referring to FIG. 4, a particular illustrative embodiment of a method of operating the device 100 of FIG. 1 and the device 200 of FIG. 2 is depicted and generally designated 400. The method 400 includes determining a control setting, at 402. For example, the control logic 102 of FIGS. 1 and 2 may determine the control setting 108 to apply to the DCO 104. In a particular embodiment, the control setting may be determined during a time period. Oscillation of a DCO may be selectively stopped after a time period, at 404. To illustrate, the enable 110 of FIGS. 1 and 2 may selectively stop oscillation of the DCO 104. The DCO may be configured to remain in an active mode after the time period. For example, the DCO 104 of FIGS. 1 and 2 may remain in an active mode (i.e., in contrast to a test mode, a sleep mode, or a power-down mode) after the time period. To illustrate, while oscillation of the DCO 104 is stopped based on a value of the enable 110, the DCO 104 may remain in an active mode to receive the control setting 108 and to adjust a delay of the variable-delay element 226. By remaining in active mode after the time period and while oscillation of the DCO 104 is stopped, the DCO 104 may adjust a period of the output clock 114 that would be produced if the DCO 104 were allowed to oscillate.

The control setting may be applied to the DCO, at 406. For example, the control logic 102 of FIGS. 1 and 2 may apply the control setting 108 to the DCO. To illustrate, a modified control setting may be determined during the time period and the modified control setting may be applied to the DCO during a second time period. Oscillation of the DCO may be restarted after a second time period, at 408. For example, the stoppage logic 106 of FIGS. 1 and 2 may restart oscillation of the DCO 104 after a second time period. The method 400 may further include disabling portions of the DCO based on the control setting. To illustrate, in FIG. 2, portions of the variable delay element 226 that do not contribute to a total delay of the variable delay element 226 may be disabled. For example, disabling portions of the variable delay element 226 may reduce dynamic power consumption.

The method 400 of FIG. 4 may be implemented by an application-specific integrated circuit (ASIC), a field-programmable gate array (FPGA) device, a processing unit such as a central processing unit (CPU), a digital signal processor (DSP), a controller, another hardware device, firmware device, or any combination thereof. As an example, the method of FIG. 4 can be performed by or in response to signals or commands from a processor that executes instructions, as described with respect to FIG. 5.

Figure 5:
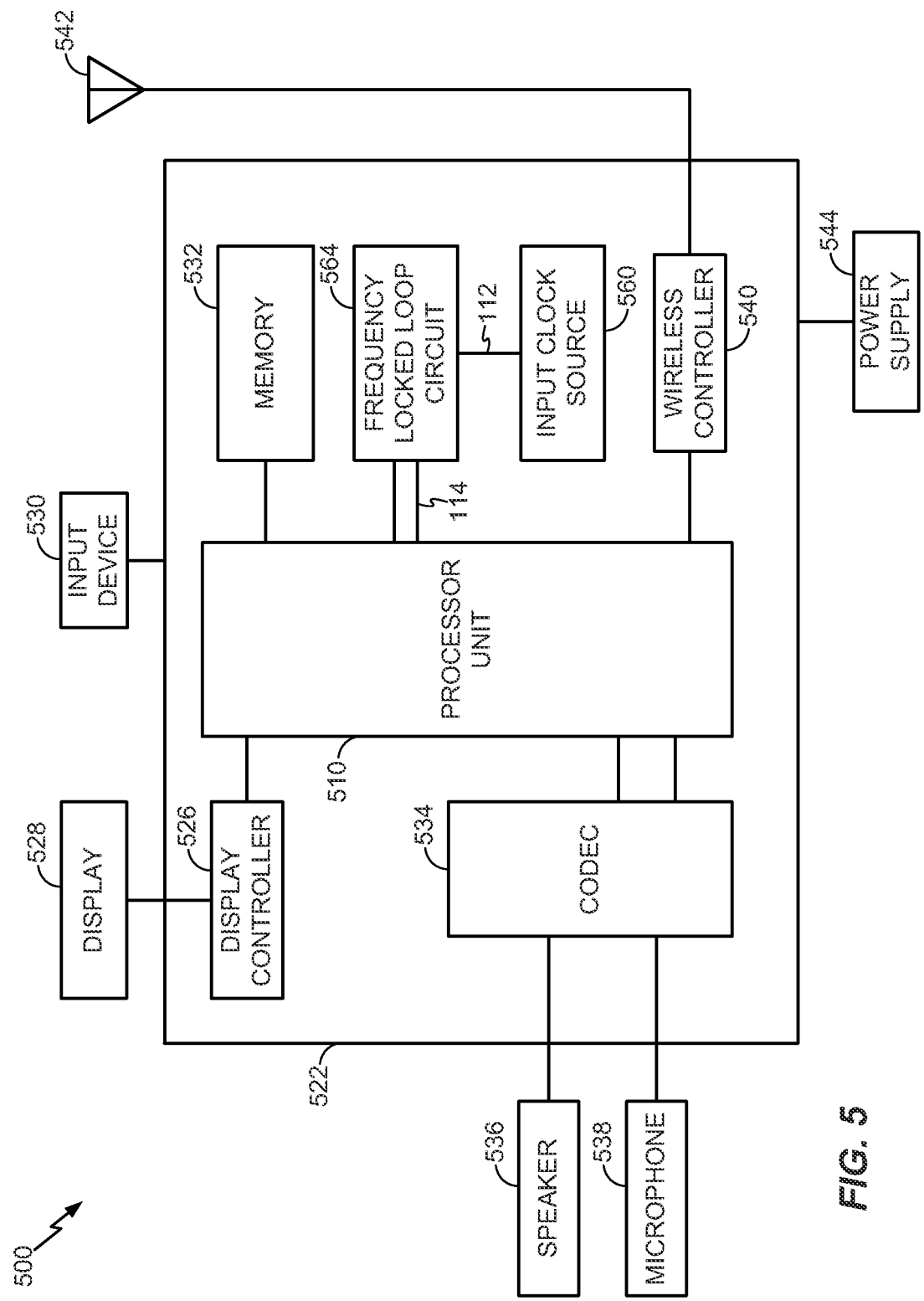
FIG. 5 is a block diagram of a wireless device including a frequency locked loop circuit.

Referring to FIG. 5, a block diagram of a particular illustrative embodiment of a wireless communication device is depicted and generally designated 500. The wireless communication device 500 includes a processor unit 510, such as a digital signal processor (DSP), coupled to a memory 532. The wireless communication device 500 may include a DCO-based frequency locked loop circuit 564 and an input clock source 560. In an illustrative embodiment, the DCO-based frequency locked loop circuit 564 may correspond to the device 100 of FIG. 1 or the device 200 of FIG. 2, may operate according to the method of FIG. 4, or any combination thereof.

The memory 532 may be a non-transitory computer readable medium storing program code that is executable by the processor unit 510 (e.g., a computer) to cause the processor unit 510 to determine a control setting. For example, the computer-executable program code may cause the processor unit 510 to compare a number of cycles of the output clock 114 during one or more clock periods of the input clock 112 against a target number, and to determine a control setting based on the comparison. Additionally, the computer-executable program code may cause the processor unit 510 to selectively stop oscillation of a DCO after a time period. For example, the computer-executable program code may cause the processing unit 510 to generate an enable output having a value that selectively stops oscillation of a DCO after a time period. The DCO may remain in an active mode after the time period. The computer-executable program code may further cause the processor unit 510 to apply the control setting to the DCO.

FIG. 5 also shows a display controller 526 that is coupled to the processor unit 510 and to a display 528. A coder/decoder (CODEC) 534 can also be coupled to the processor unit 510. A speaker 536 and a microphone 538 can be coupled to the CODEC 534.

FIG. 5 indicates that a wireless controller 540 can be coupled to the processor unit 510 and to a wireless antenna 542. In a particular embodiment, the processor unit 510, the DCO-based frequency locked loop circuit 564, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

While FIG. 5 illustrates a particular embodiment of a wireless device 500, one or more frequency locked loop circuits (e.g., the DCO based frequency locked loop 564) may be integrated in other electronic devices including a set top box, a music player, a video player, an entertainment unit, a navigation device, a communications device, a personal digital assistant (PDA), a fixed location data unit, and a computer.

In conjunction with the described embodiments, an apparatus is disclosed that may include means for determining a control setting. For example, the means for determining a control setting may include the control logic 102 of FIG. 1, the control logic 102 of FIG. 2, one or more other devices or circuits configured to determine a control setting, or any combination thereof. The apparatus may also include means for selectively stopping oscillation of a DCO after a time period, where the DCO is configured to remain in an active mode after the time period. The means for selectively stopping oscillation of a DCO after a time period may include the stoppage logic 106 of FIG. 1, the stoppage logic 106 of FIG. 2, one or more other devices or circuits configured to selectively stop oscillation of a DCO after a time period, or any combination thereof. The apparatus may further include means for applying the control setting to the DCO. For example, the means for applying the control setting to the DCO may include the control logic 102 of FIG. 1, the control logic 102 of FIG. 2, one or more other devices or circuits configured to apply the control setting to the DCO.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a digitally controlled oscillator configured to oscillate during a first time period;
   logic to selectively stop oscillation of the digitally controlled oscillator after the first time period, wherein the digitally controlled oscillator is configured to remain in an active mode during a second time period while the oscillation is stopped, wherein stopping oscillation of the digitally controlled oscillator does not shorten a high phase or a low phase of the digitally controlled oscillator; and
   control logic that determines a modified control setting during the first time period while the digitally controlled oscillator oscillates and that selectively applies the modified control setting to the digitally controlled oscillator during the second time period while the oscillation is stopped.

2. The device of claim 1, wherein a frequency of an output clock of the digitally controlled oscillator is based on the modified control setting.

3. The device of claim 2, wherein the frequency of the output clock is approximately an integer multiple of a frequency of an input clock.

4. The device of claim 3, wherein the control logic determines the modified control setting based on a number of cycles of the output clock during one or more clock periods of the input clock.

5. The device of claim 2, further comprising serially connected flip-flops that are clocked by the output clock.

6. The device of claim 1, wherein the control logic is configured to apply an initial control setting to the digitally controlled oscillator during the first time period.

7. The device of claim 1, wherein the logic is configured to restart oscillation of the digitally controlled oscillator after the second time period.

8. The device of claim 7, wherein the logic is further configured to selectively stop oscillation of the digitally controlled oscillator after a third time period.

9. The device of claim 1, wherein the modified control setting is applied to a variable delay element of the digitally controlled oscillator.

10. The device of claim 2, wherein the output clock of the digitally controlled oscillator is provided to a processing circuit and wherein the digitally controlled oscillator shares a power supply with the processing circuit.

11. The device of claim 1, further comprising a divider configured to divide an input clock and to generate a divided clock, wherein the divided clock is input to the control logic.

12. The device of claim 1, further comprising a divider configure to divide an output clock of the digitally controlled oscillator.

13. The device of claim 1, wherein the digitally controlled oscillator and the control logic are configured to be tested using at least one automatic test pattern generation test.

14. A method comprising:
    determining a modified control setting while a digitally controlled oscillator oscillates during a first time period;
    selectively stopping oscillation of the digitally controlled oscillator after the first time period, wherein the digitally controlled oscillator is configured to remain in an active mode during a second time period while the oscillation is stopped, wherein stopping oscillation of the digitally controlled oscillator does not shorten a high phase or a low phase of the digitally controlled oscillator; and
    applying the modified control setting to the digitally controlled oscillator during the second time period while the oscillation is stopped.

15. The method of claim 14, wherein a frequency of an output clock of the digitally controlled oscillator is based on the modified control setting.

16. The method of claim 15, wherein the frequency of the output clock is approximately an integer multiple of a frequency of an input clock.

17. The method of claim 16, wherein the modified control setting is determined by control logic based on a number of cycles of the output clock during one or more clock periods of the input clock.

18. The method of claim 14, wherein the oscillation is selectively stopped without causing clock glitch events in an output clock of the digitally controlled oscillator.

19. The method of claim 14, wherein the first time period is at least one clock period of an output clock of the digitally controlled oscillator.

20. The method of claim 14, wherein the modified control setting is applied to a variable delay element of the digitally controlled oscillator.

21. The method of claim 14, further comprising providing an indication that a frequency of an output clock of the digitally controlled oscillator is within a tolerance range of a desired frequency.

22. The method of claim 14, further comprising disabling portions of the digitally controlled oscillator based on the modified control setting.

23. An apparatus comprising:
    means for determining a modified control setting while a digitally controlled oscillator oscillates during a first time period;
    means for selectively stopping oscillation of the digitally controlled oscillator after the first time period, wherein the digitally controlled oscillator is configured to remain in an active mode during a second time period while the oscillation is stopped, wherein stopping oscillation of the digitally controlled oscillator does not shorten a high phase or a low phase of the digitally controlled oscillator; and
    means for applying the modified control setting to the digitally controlled oscillator during the second time period while the oscillation is stopped.

24. A non-transitory computer-readable medium including program code that, when executed by a processor, causes the processor to:
- determine a modified control setting while a digitally controlled oscillator oscillates during a first time period;
- selectively stop oscillation of the digitally controlled oscillator after the first time period, wherein the digitally controlled oscillator is configured to remain in an active mode during a second time period while the oscillation is stopped, wherein stopping oscillation of the digitally controlled oscillator does not shorten a high phase or a low phase of the digitally controlled oscillator; and
- apply the modified control setting to the digitally controlled oscillator during the second time period while the oscillation is stopped.

25. A device comprising:
- a digitally controlled oscillator configured to oscillate during a first time period, wherein the first time period is at least one clock period of an output clock of the digitally controlled oscillator;
- logic to selectively stop oscillation of the digitally controlled oscillator after the first time period, wherein the digitally controlled oscillator is configured to remain in an active mode during a second time period while the oscillation is stopped; and
- control logic that determines a modified control setting during the first time period while the digitally controlled oscillator oscillates and that selectively applies the modified control setting to the digitally controlled oscillator during the second time period while the oscillation is stopped.

26. A method comprising:
- determining a modified control setting while a digitally controlled oscillator oscillates during a first time period, wherein the first time period is at least one clock period of an output dock of the digitally controlled oscillator;
- selectively stopping oscillation of the digitally controlled oscillator after the first time period, wherein the digitally controlled oscillator is configured to remain in an active mode during a second time period while the oscillation is stopped; and
- applying the modified control setting to the digitally controlled oscillator during the second time period while the oscillation is stopped.

* * * * *